United States Patent
Laven et al.

(10) Patent No.: US 10,229,990 B2
(45) Date of Patent: *Mar. 12, 2019

(54) SEMICONDUCTOR DEVICE HAVING A DESATURATION CHANNEL STRUCTURE FOR DESATURATING A CHARGE CARRIER CONCENTRATION IN AN IGBT CELL

(71) Applicant: Infineon Technologies AG, Neubiberg (DE)

(72) Inventors: Johannes Georg Laven, Taufkirchen (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/438,798

(22) Filed: Feb. 22, 2017

(65) Prior Publication Data

US 2017/0162682 A1    Jun. 8, 2017

Related U.S. Application Data

(60) Continuation of application No. 14/679,583, filed on Apr. 6, 2015, now Pat. No. 9,621,133, which is a
(Continued)

(51) Int. Cl.
*H01L 29/739* (2006.01)
*H01L 29/66* (2006.01)
(Continued)

(52) U.S. Cl.
CPC ...... *H01L 29/7397* (2013.01); *H01L 21/2253* (2013.01); *H01L 21/266* (2013.01);
(Continued)

(58) Field of Classification Search
CPC ........... H01L 21/02381; H01L 21/0242; H01L 21/02505; H01L 21/02538;
(Continued)

(56) References Cited

U.S. PATENT DOCUMENTS

| 5,894,139 A | 4/1999 | Otsuki et al. |
| 6,049,108 A | 4/2000 | Williams et al. |

(Continued)

FOREIGN PATENT DOCUMENTS

| CN | 1950947 A | 4/2007 |
| DE | 102007003812 A1 | 8/2008 |

(Continued)

OTHER PUBLICATIONS

Sumitomo, M. et al., "Low loss IGBT with Partially Narrow Mesa Structure (PNM-IGBT)", Proceedings of the 2012 24th International Symposium on Power Semiconductor Devices and ICs, Bruges, Belgium, Jun. 3-7, 2012, pp. 17-20.

*Primary Examiner* — Jarrett J Stark
(74) *Attorney, Agent, or Firm* — Murphy, Bilak & Homiller, PLLC

(57) ABSTRACT

A semiconductor device includes a first IGBT cell having a second-type doped drift zone and a desaturation semiconductor structure for desaturating a charge carrier concentration in the first IGBT cell. The desaturation semiconductor structure includes a first-type doped region forming a pn-junction with the drift zone and two trenches arranged in the first-type doped region and arranged beside the first IGBT cell in a lateral direction. The two trenches confine a mesa region including a first-type doped desaturation channel region and a first-type doped body region at least in the lateral direction. The desaturation channel region and the body region adjoin each other, and the desaturation channel region is a depletable region.

18 Claims, 10 Drawing Sheets

Related U.S. Application Data division of application No. 13/743,918, filed on Jan. 17, 2013, now Pat. No. 9,024,413.

(51) Int. Cl.
| | |
|---|---|
| *H03K 17/041* | (2006.01) |
| *H01L 29/10* | (2006.01) |
| *H03K 3/012* | (2006.01) |
| *H03K 17/60* | (2006.01) |
| *H01L 21/225* | (2006.01) |
| *H01L 21/266* | (2006.01) |
| *H01L 21/28* | (2006.01) |
| *H01L 27/088* | (2006.01) |
| *H01L 29/06* | (2006.01) |
| *H01L 29/423* | (2006.01) |
| *H03K 17/567* | (2006.01) |

(52) U.S. Cl.
CPC .... *H01L 21/2822* (2013.01); *H01L 21/28238* (2013.01); *H01L 27/088* (2013.01); *H01L 29/0657* (2013.01); *H01L 29/0696* (2013.01); *H01L 29/105* (2013.01); *H01L 29/1095* (2013.01); *H01L 29/4236* (2013.01); *H01L 29/66325* (2013.01); *H01L 29/66348* (2013.01); *H01L 29/7393* (2013.01); *H03K 3/012* (2013.01); *H03K 17/04113* (2013.01); *H03K 17/567* (2013.01); *H03K 17/60* (2013.01)

(58) Field of Classification Search
CPC ............. H01L 21/02636; H01L 21/047; H01L 21/0485; H01L 21/049; H01L 21/22
USPC .......... 257/566, E29.027, E29.066, E29.197, 257/E29.201
See application file for complete search history.

(56) References Cited

U.S. PATENT DOCUMENTS

| | | | |
|---|---|---|---|
| 6,913,977 B2 | 7/2005 | Pattanayak | |
| 7,294,885 B2 | 11/2007 | Tihanyi | |
| 9,024,413 B2 * | 5/2015 | Laven ............... | H01L 29/66325 257/566 |
| 9,859,408 B2 | 1/2018 | Mauder et al. | |
| 2004/0041171 A1 | 3/2004 | Ogura et al. | |
| 2008/0179666 A1 | 7/2008 | Foerster et al. | |
| 2010/0267209 A1 | 10/2010 | Ooki | |
| 2012/0018846 A1 | 1/2012 | Baburske et al. | |
| 2012/0104555 A1 | 5/2012 | Bobde et al. | |

FOREIGN PATENT DOCUMENTS

| | | | |
|---|---|---|---|
| DE | 102011052731 A1 | 3/2012 | |
| DE | 102012209188 A1 | 12/2012 | |
| DE | 102014226161 B4 | 10/2017 | |
| EP | 0746030 A2 | 12/1996 | |
| JP | WO 2012120359 A2 * | 9/2012 | ......... H01L 29/0696 |

* cited by examiner

SEMICONDUCTOR DEVICE HAVING A DESATURATION CHANNEL STRUCTURE FOR DESATURATING A CHARGE CARRIER CONCENTRATION IN AN IGBT CELL

TECHNICAL FIELD

Embodiments described herein relate to semiconductor devices comprising an IGBT cell and methods for operating and manufacturing such semiconductor devices, and particularly some embodiments relate to power semiconductor devices with trench IGBT cells.

BACKGROUND

An insulated-gate bipolar transistor, hereinafter referred to as IGBT, is a three-terminal semiconductor device primarily used as an electronic switch and may combine high efficiency and fast switching. The IGBT may switch electric power in many applications, e.g., appliances such as electric cars, trains, variable speed refrigerators, air-conditioners and many more.

The IGBT combines the gate-drive characteristics of a MOSFET with the high-current and low-saturation-voltage capability of bipolar transistors by combining, in a single device, an isolated gate field effect transistor (FET) for the control input and a bipolar power transistor for switching.

The IGBT can exhibit power loss in the on-state and during switching. For instance, minority carriers (holes) may take time to recombine or to leave the device, resulting in longer switching times and higher switching loss. Increasing the external gate resistance to avoid steep flanks of the switching characteristic can further delay this process. The static losses in the on-state may be reduced by increasing the electron-hole concentration (plasma concentration) in the device. This, however, leads to a further increase of the dynamic losses due to the above-described effect, and there is a trade-off between static and dynamic losses.

Therefore, there is a need for improved semiconductor devices and improved methods relating to the operation and manufacture of semiconductor devices, wherein the switching losses are reduced without significantly increasing the static losses.

SUMMARY

According to one embodiment, a semiconductor device is provided. The semiconductor device includes a first IGBT cell including a second-type doped drift zone. The semiconductor device also includes a desaturation semiconductor structure for desaturating a charge carrier concentration in the first IGBT cell. The desaturation semiconductor structure includes a first-type doped region forming a pn-junction with the drift zone. The desaturation semiconductor structure further includes two portions of a trench or two trenches arranged in the first-type doped region and arranged beside the first IGBT cell in a lateral direction. Each of the two trench portions or each of the two trenches has a wide part below a narrow part. The wide parts of the two trench portions or of the two trenches confine a first-type doped desaturation channel region of the first-type doped region at least in the lateral direction. The narrow parts of the two trench portions or of the two trenches confine a first-type doped mesa region of the first-type doped region at least in the lateral direction. The desaturation channel region has a width smaller than the mesa region in the lateral direction. The desaturation channel region and the mesa region adjoin each other.

According to another embodiment, a method of operating a semiconductor device is provided. The semiconductor device includes a first electrode terminal, a second electrode terminal, a gate electrode terminal, and a first IGBT cell including a gate electrode, a first electrode, a second electrode and a drift region. The gate electrode is connected to the gate electrode terminal, the first electrode is connected to the first electrode terminal, and the second electrode is connected to the second electrode terminal. The semiconductor device further includes a desaturation semiconductor structure including a desaturation channel. A first portion of the desaturation semiconductor structure is connected to the first electrode terminal. A second portion of the desaturation semiconductor structure is connected to the gate electrode terminal for controlling the desaturation channel. The method includes applying a gate voltage with a first value to the gate electrode terminal, wherein a current flows through the first IGBT cell between the first electrode terminal and the second electrode terminal and wherein a current flow through the desaturation channel is substantially blocked. The method further includes applying the gate voltage with a second value to the gate electrode terminal. The absolute value of the second value is lower than the absolute value of the first value. Therein, a current flows through the first IGBT cell between the first electrode terminal and the second electrode terminal and charge carriers flow as a desaturating current from the drift region of the first IGBT cell through the desaturation channel of the desaturation semiconductor structure to the first electrode terminal. The method further includes applying the gate voltage with a third value to the gate electrode terminal. The absolute value of the third value is lower than the respective absolute values of the first and second values. Therein, a current flow through the first IGBT cell between the first electrode terminal and the second electrode terminal is substantially blocked.

According to a further embodiment, a method of forming a bottleneck-type trench structure of a semiconductor device is provided. The method includes forming a trench in a semiconductor layer of the semiconductor device. The trench has lateral sides and a bottom side. The method includes introducing a dopant into the bottom side, heating the semiconductor device to diffuse the dopant into a diffusion region, and selectively etching the diffusion region to form the bottleneck-type trench structure.

Further aspects, advantages and features of the present invention are apparent from the dependent claims, the description and the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Reference will now be made in detail to various embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims. The embodiments can be combined unless noted otherwise. The drawings may not necessarily be drawn to scale.

For ease of understanding, an IGBT structure is often described with specific doping types, e.g., an n-p-n-p structure, without intending any limitation. The dopings could be reversed, i.e., an n-type doping could become a p-type doping and vice versa. Where a "first-type doping" and a "second-type doping" is referred to, the first-type doping may be p-type doping or n-type doping, and the second-type doping is to be understood as the opposite doping, i.e., n-type if the first-type doping is p-type, and p-type if the first-type doping is n-type.

Figure 1:
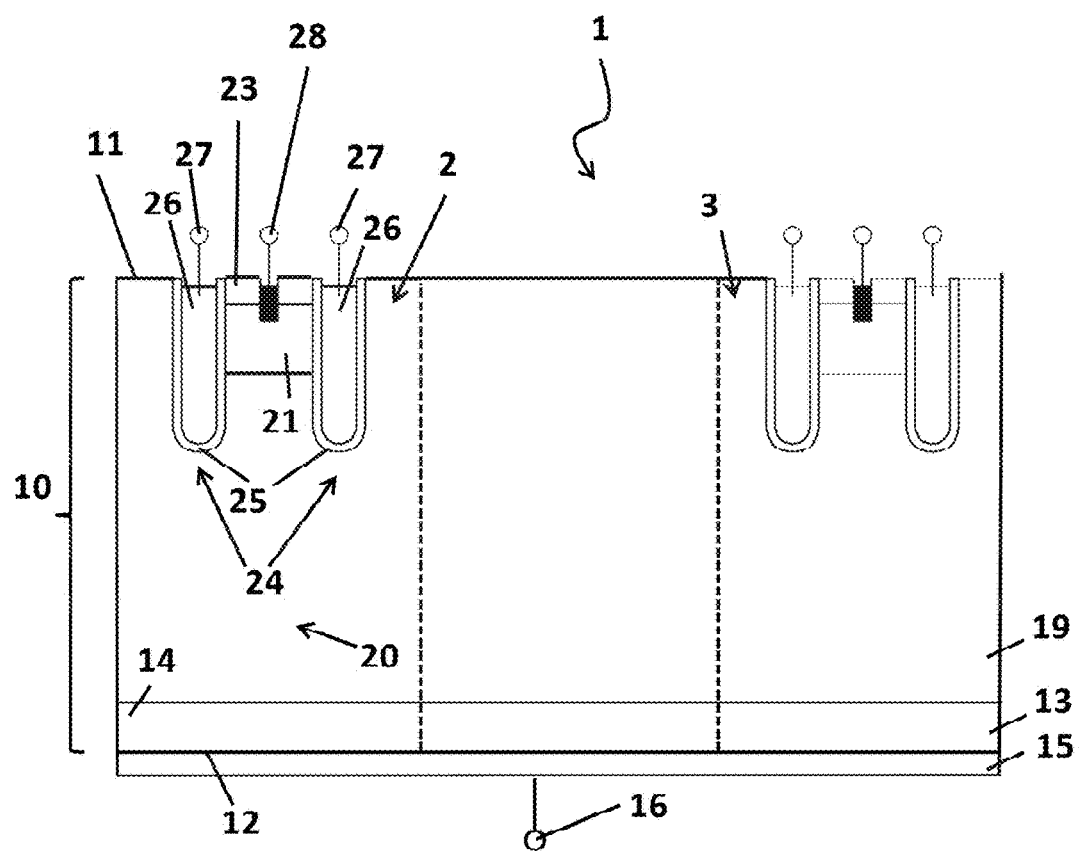
FIG. 1 shows a semiconductor device including IGBT cells.

FIG. 1 shows a cross-section through a semiconductor device 1. The semiconductor device 1 includes a semiconductor block 10 which may include one or more semiconductor layers. The semiconductor block may include an epitaxial layer. The semiconductor device 1 includes a front surface or first main surface 11, which is the top surface in FIG. 1.

Any direction lying in the first main surface is called a lateral direction. The direction perpendicular to the first main surface is called the vertical direction. In FIG. 1, the cross-section shows a cut along one lateral direction through a section of the semiconductor device.

The semiconductor device 1 includes a p-type doped semiconductor layer 13, an n-type doped semiconductor layer 19, which can be, e.g., an epitaxially grown layer or layer formed by a float-zone Czochalski growth process. The outer surface of the p-type doped semiconductor layer, i.e., the lower surface 12 in FIG. 1, forms a back surface of the semiconductor block 10. The back surface or second main surface 12 is substantially parallel to the first main surface 11. The back surface 12 is in contact with a drain or collector metallization 15, which, in turn, is connected to a drain or collector electrode terminal 16.

An IGBT cell 2 is shown. The IGBT cell 2 includes a p-type doped drain region 14, also known as a collector region, being a part of the semiconductor layer 13. The IGBT cell further includes an n-type doped region being a part of the n-type doped semiconductor layer 19. A trench structure is formed in the n-type doped region of the IGBT cell 2. The trench structure includes two trenches 24 or two portions 24 of a single trench. For instance, in a stripe geometry of the IGBT cell, there may be two separate trenches 24, whereas the structures shown in the cross-section at reference signs 24 may be two trench portions of one trench if this trench has, e.g., a rectangular or possibly polygonal, oval or circular layout in a top view on the first main surface 11. The trenches or trench portions 24 extend from the first main surface 11 into the semiconductor layer 19, and have side surfaces at least in one lateral direction, and a bottom surface.

With respect to trenches or trench portions, the terms "below" or "deeper" shall signify that a first entity is closer to the trench bottom relative to a second entity, and, conversely, this second entity is "above" or "higher" relative to the first entity. A bottom part of a trench or trench portion shall mean a part adjoining the bottom, and a top part shall mean a part adjoining the first main surface.

The trenches or trench portions 24 are filled, e.g., with a highly doped polysilicon material or other semiconductor material, forming a gate electrode. This material is connected to a gate electrode terminal 27 and is insulated by a gate oxide 25 from the semiconductor layer 19 and from a p-type doped body region 21 and n-type doped source/emitter region 23 formed therein. In a stripe geometry, the trenches 24 confine the body region and the source or emitter region 23 in the lateral direction shown in FIG. 1. When structures 24 are portions of a single trench, then these portions confine the body and source region also in at least one further lateral direction, e.g., in a direction perpendicular to the plane of drawing.

In FIG. 1, the source region 23 and body region 21 are connected to a source electrode terminal 28. Between the body region 21 and the drain region 14 lies an n-type doped drift region 20 of the semiconductor layer 19. The source region adjoins the body region, which adjoins the drift region, which, in turn, adjoins the drain region 14, forming an n-p-n-p structure of an integrated gate bipolar transistor.

Semiconductor devices described herein, in particular a power semiconductor device, typically include many IGBT cells. In FIG. 1, one further IGBT cell 3 is shown exemplarily, arranged laterally from the IGBT cell 2 in the lateral direction shown in FIG. 1.

The gate electrode 26 controls the formation of an inversion channel in the body region 21, between the source region 23 and drift region 20, by a gate voltage applied to the gate electrode terminal 27. If the gate voltage is applied with a value above a threshold value, the inversion channel is established, and the device is in the on-state. If the gate voltage is applied with a value below the threshold value, the device switches into the off-state. During the switching process, switching losses can occur.

Figure 2:
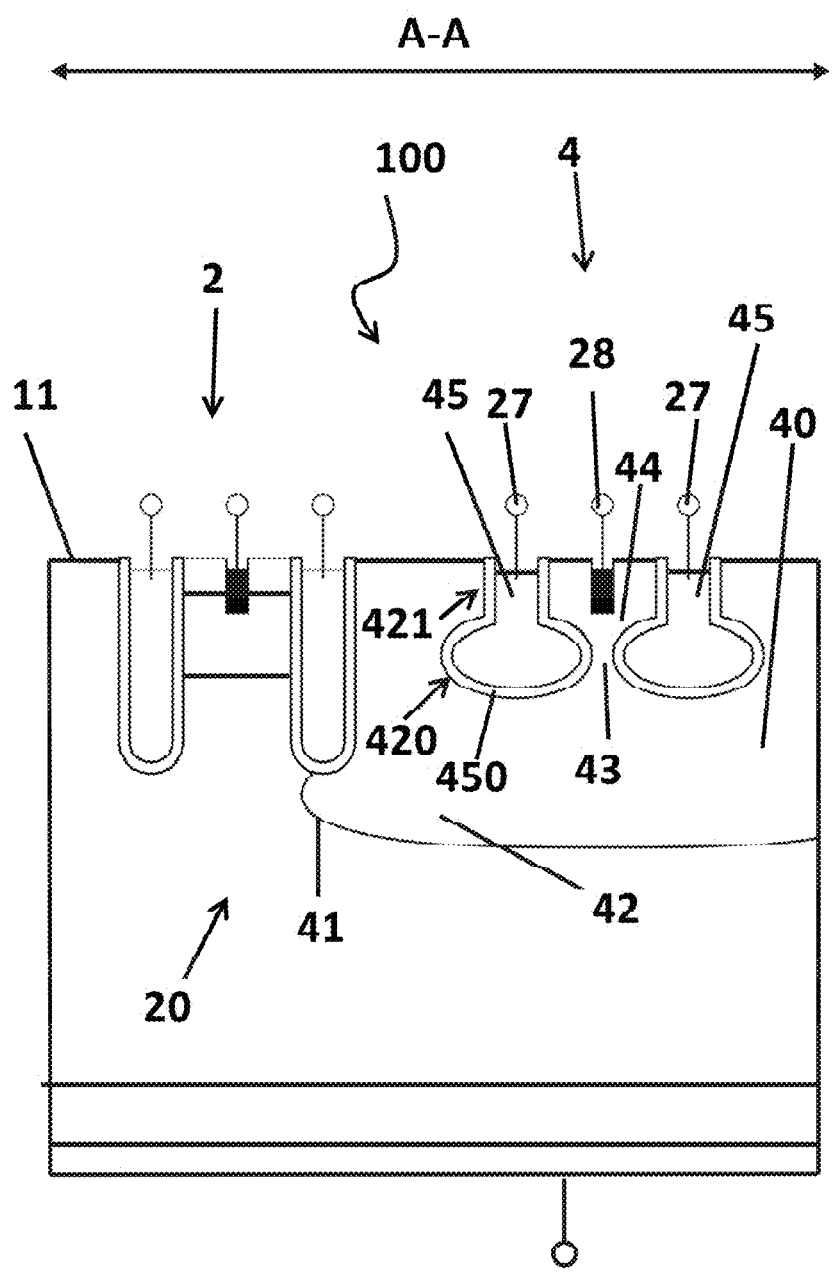
FIGS. 2 and 3 show a semiconductor device including a desaturation channel structure according to embodiments described herein.

FIG. 2 shows a semiconductor device 100 according to an embodiment of the present invention. The semiconductor device includes an IGBT cell 2, which may be a trench IGBT cell as described with respect to FIG. 1. The IGBT cell 2 includes a drift region 20.

The semiconductor device 100 further includes a desaturation channel structure 4, also referred to herein as a desaturation cell. The spatial structure of the desaturation channel structure 100 will be described with respect to FIGS. 2 and 3, and the operation of the desaturation channel structure 100 will be described with respect to FIGS. 4 and 5.

As shown in FIG. 2, the desaturation channel structure 4 includes a p-type doped region 40 forming a pn-junction 41 with the drift region 20 of the IGBT cell 2. A trench structure is formed in the p-type doped region 40, including two trenches 45 or two portions of one trench 45, depending on the geometry of the desaturation cell. The trench structure is arranged beside the IGBT cell 2 in the lateral direction A-A.

The trenches or trench portions 45 each have a wide part 420 and a narrow part 421, wherein the wide part of each trench or trench portion is arranged below the narrow part of each trench or trench portion. The wide parts 420 are bottom parts and the narrow parts are top parts of the trenches/trench portions 45 in FIG. 2. The two wide parts 420 of the respective trenches/trench portions 45 confine or delimit a desaturation channel region 43 of the first-type doped region 40 at least in the lateral direction A-A shown in FIG. 2. The two narrow parts 421 of the respective trenches/trench portions confine or delimit a mesa region 44 of the first-type doped region 40 at least in the lateral direction A-A shown in FIG. 2. The mesa region 44 does not include an n-type doped region in the embodiment shown in FIG. 2. The desaturation channel region adjoins, i.e., is directly adjacent to the mesa region 44 and to an outer region 42 of the first-type doped region 40, the outer region 42 extending outside of the trench structure. The desaturation channel region is narrower than the mesa region 44 at least in the lateral direction A-A.

The trenches/trench portions 45 are filled with a conductive material, e.g., a semiconductor material such as highly doped polysilicon, or a carbon material or a metal such as aluminum, copper or molybdenum, forming trench electrodes or a trench electrode connected to the gate electrode terminal 27 and insulated from the p-type doped region 40 by an oxide layer or n-type doped layer 450. The mesa region 44 is connected to the source electrode terminal 28.

The desaturation channel structure 4 is adapted to desaturate a charge carrier concentration in the drift region 20 of the IGBT cell 2, in particular a minority carrier concentration of holes, when the IGBT cell is in the process of switching off. The value of the gate voltage applied to the trench electrode(s) controls whether the desaturation channel in the desaturation channel region is open or closed. When it is open, the charge carriers can then pass from the drift region 20 through the outer region 42, desaturation channel region 43 and mesa region 44 to the source electrode terminal 28, forming a desaturation current.

Figure 3:
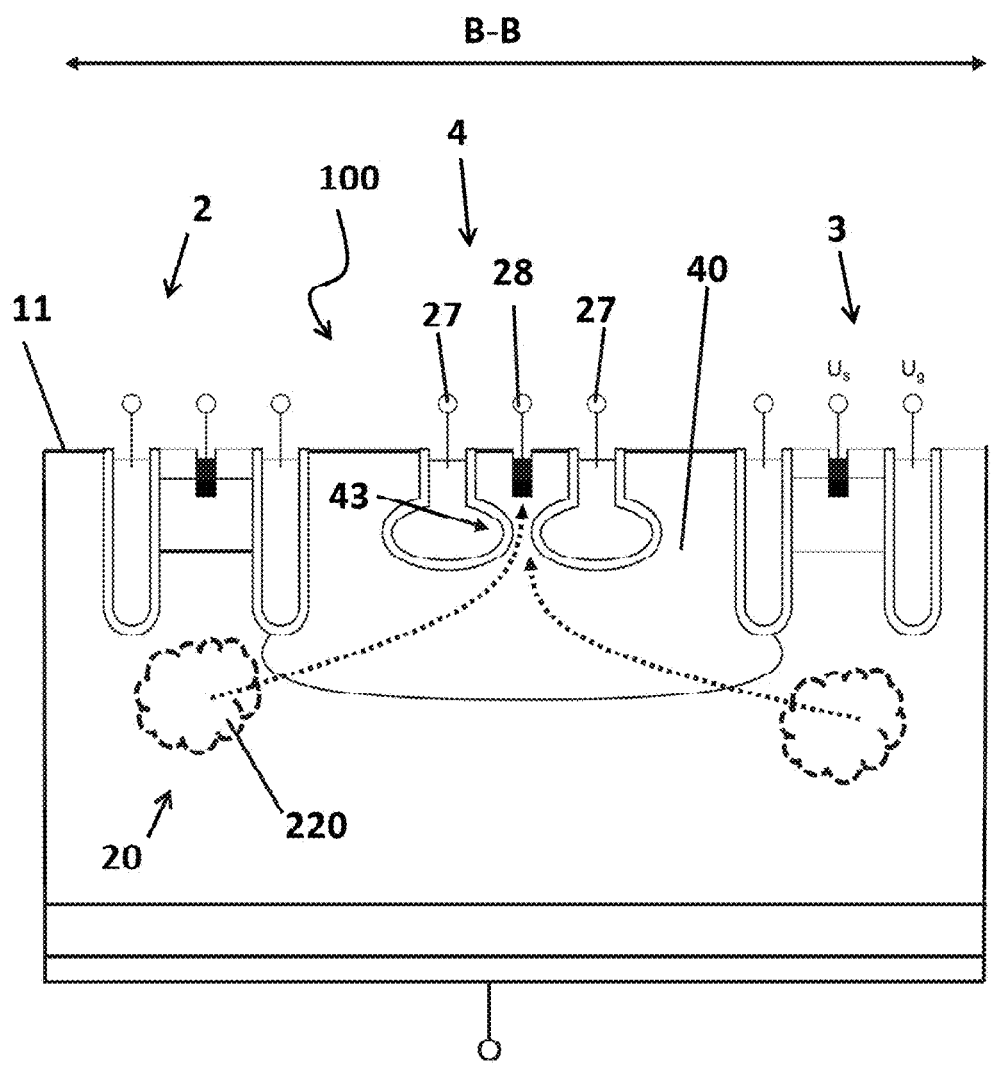

This is schematically illustrated in FIG. 3, where the charge carrier concentration is symbolically shown as a cloud 220. In FIG. 3, the p-type doped region 40 extends between the first IGBT cell 2 and a second IGBT cell 3, also forming a pn-junction with the drift region of the second IGBT cell. The trench structure of the desaturation structure 4 is arranged midway between the first and second IGBT cells 2 and 3 in this embodiment. The desaturation channel structure 4 is adapted to also desaturate a charge carrier concentration in the drift region of the second IGBT cell 3 as schematically indicated in FIG. 3.

Figure 4:
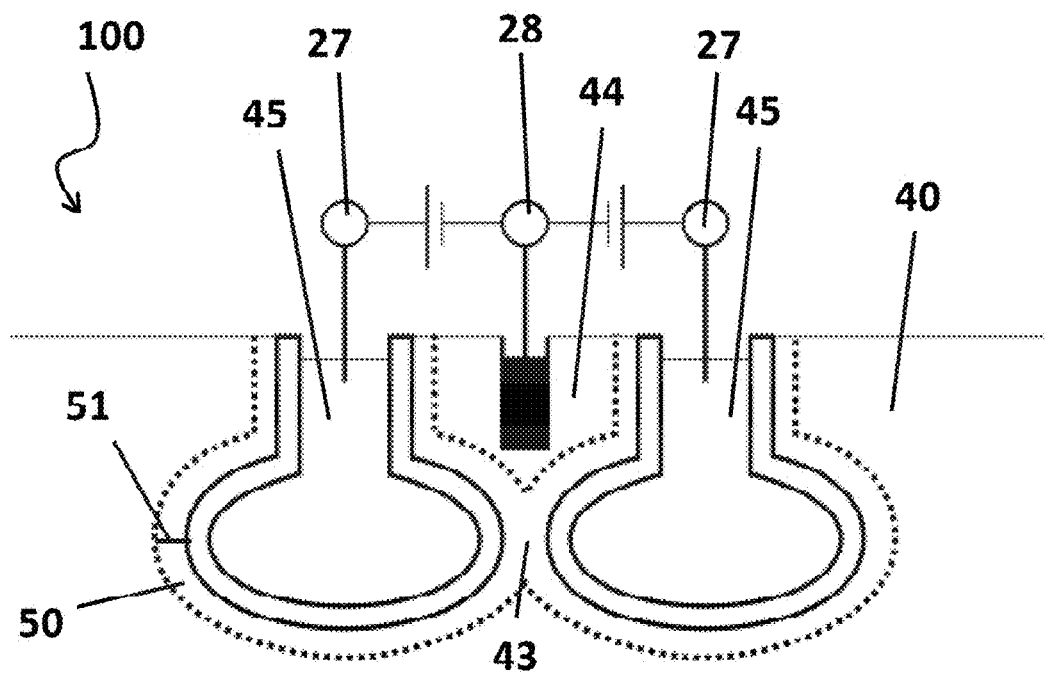
FIGS. 4 and 5 illustrate a method of operating a semiconductor device according to embodiments described herein.
Figure 5:
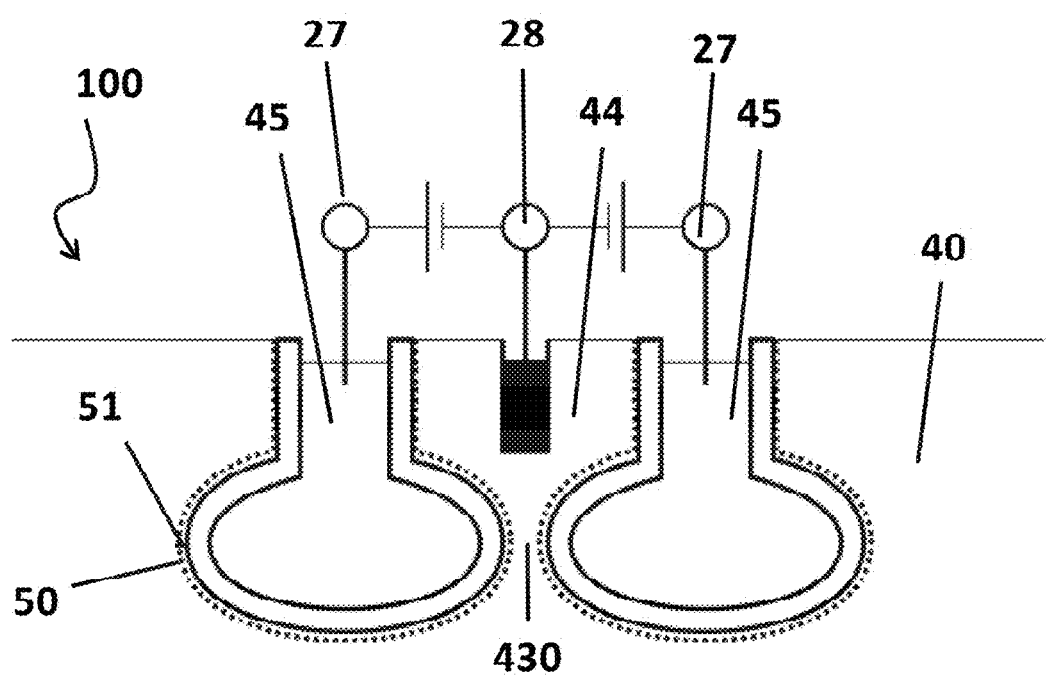

FIGS. 4 and 5 schematically illustrate how the opening or blocking of the desaturation channel 430 in the desaturation channel region 43 is controlled by the gate voltage applied to the gate electrode terminal 27. The width of the desaturation channel region 43 in the lateral direction where the wide parts of the trenches/trench portions 45 confine the desaturation channel region, and the doping of the desaturation channel region 43 are chosen such that the desaturation channel region is depleted at the operating voltage of the IGBT cell(s), having, e.g., a value of +15 V between gate and source terminal. A depletion region 50 around the trench electrode(s) 45 is shown in FIG. 4. The depletion region 50 at the operating voltage of the IGBT cell(s) extends across the entire desaturation channel region 43 in FIG. 4, which is therefore non-conducting. The desaturation channel is blocked.

At a lower gate-to-source terminal voltage, the depletion zone 50 shrinks, at least a part of the desaturation channel region connecting the outer region and the mesa region becomes conducting, and the desaturation channel 430 opens. The width and doping of the desaturation channel region 43 is chosen such that the desaturation channel opens before the electron current through the IGBT cell(s) switches off, i.e., while the inversion channel of the IGBT cell(s) is still open. If the p-type doping of the desaturation channel region is small, in particular smaller than in the other regions of the p-type doped region 40, the width of the desaturation channel region may be chosen larger, and if the doping of the desaturation channel region is higher the width of the desaturation channel region can be chosen smaller. FIG. 5 shows the desaturation channel structure with an open desaturation channel 430 at, e.g., a value of +10 V of the gate-to-source terminal voltage. In this state, charge carriers (holes) saturating the drift zone of an IGBT cell may pass through the desaturation channel as illustrated, e.g., in FIG. 3. When the gate voltage is further lowered, the inversion channel of the IGBT cell(s) will be blocked, and the (electron) source-drain current will stop. After all charge carriers have been removed from the drift zone, there will also be no desaturation current in the off-state of the semiconductor device.

Figure 6:
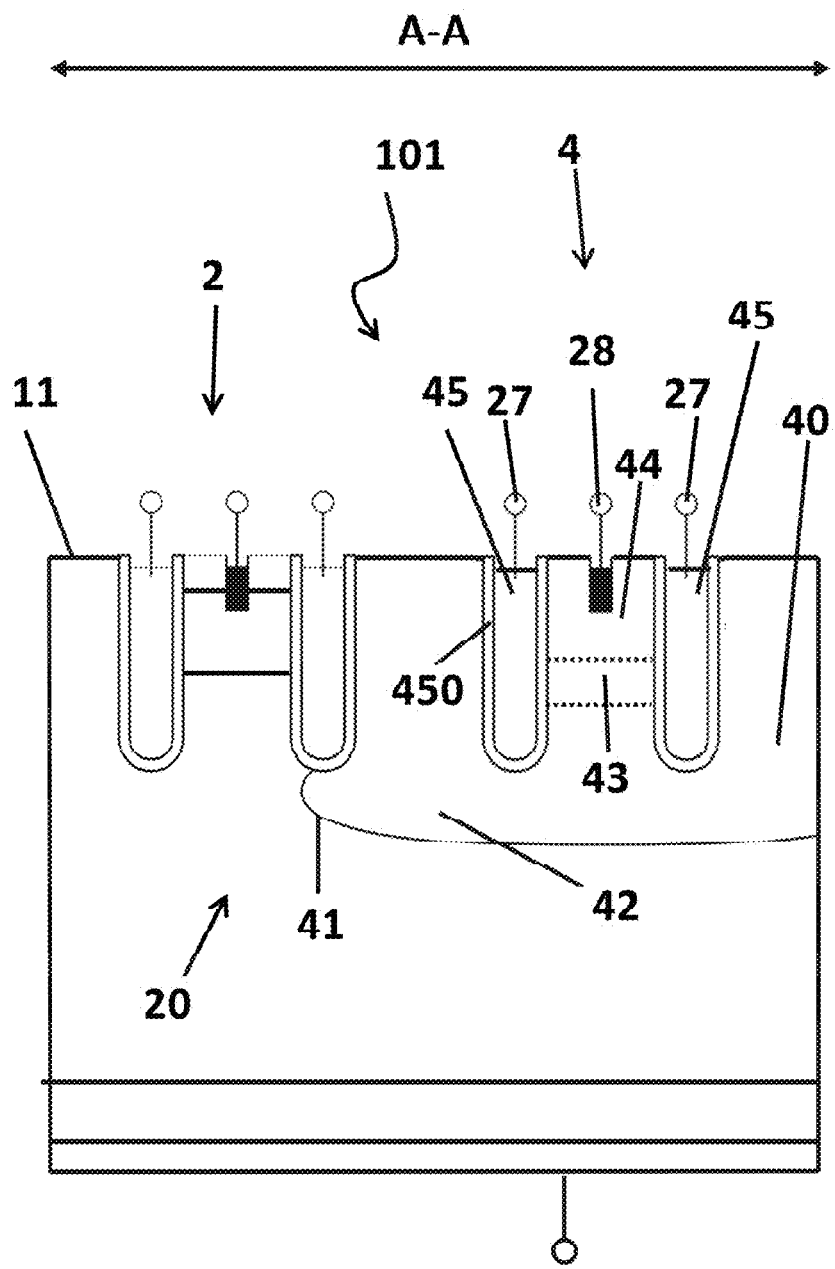
FIG. 6 shows a semiconductor device including a desaturation channel structure according to embodiments described herein.

FIG. 6 shows a further embodiment of a semiconductor device 101 including a desaturation channel structure 4. In this embodiment, the p-type doping of the desaturation channel region 43, shown between the dotted lines in FIG. 6, is lower than the p-type doping of a body region 44 and of the outer region 42 of the p-type doped region 40. The trenches or trench portions of the desaturation channel structure in the p-type doped region 40 have substantially vertical sidewalls in this embodiment. They confine a mesa region at least in one lateral direction, wherein the mesa region includes the body region 44 and the desaturation channel region 43. The mesa region also includes a portion of the outer region 42 in the embodiment shown in FIG. 6. The body region of a desaturation channel structure is not to be confused with the body region of an IGBT.

The trenches or trench portions of the desaturation channel structure are shown with a similar geometry than those of the IGBT cell 2. However, the trenches or trench portions of the desaturation channel structure may generally have a different geometry, e.g., be less deep or be narrower together than the trenches/trench portions of the IGBT cell(s). Trenches or trench portions with straight, vertical side walls may be easier to manufacture, possibly lowering the production time and cost.

The p-type doping of the desaturation channel region 43 is chosen so that, at the operating voltage (e.g., +15V), the desaturation channel region 43 is depleted and non-conductive. The doping is chosen so that, a desired voltage value for establishing the desaturation channel (e.g., +10V), the desaturation channel region is no longer fully depleted, and a conductive desaturation channel is established in the desaturation channel region.

The desaturation channel structure reduces the switching losses (turn-off losses) and provides several advantages. High minority charge carrier concentrations can be removed from the drift zone(s) before the IGBT cell(s) switch off, or at least partially removed. Therefore, it is possible to increase the electron-hole-plasma concentration in the on-state to reduce static losses without overly increasing dynamic losses during turn-off. This decoupling of static and dynamic losses improves the situation of the present-day trade-off between these quantities.

Moreover, in conventional devices, high hole current densities close to the gate electrodes of an IGBT cell can exist during turn-off when the holes are conducted from the drift zone to the source electrode terminal. As the gate electrode potential is still close to the threshold value of the electron inversion channel of the IGBT cell, the capacitive coupling of the hole current to the gate electrode could re-activate the electron inversion channel. This could lead to detrimental oscillations of the semiconductor device. In the semiconductor device with desaturation channel structure according to embodiments of the present invention, the minority charge carriers (holes) are removed from the drift zone(s) already while the electron channel of the IGBT cell(s) is still open, and along a path where no electron channel of an IGBT cell exists. Possibly detrimental oscillations of the kind described above are avoided or at least suppressed.

If the gate electrode resistance is increased to avoid steep flanks of the voltage characteristics of the device, this could lead to a delay in removing the charge carrier concentration in the drift zone in conventional devices and, in suit, to increased switching losses. The semiconductor device according to embodiments of the present invention improves this situation. Since the charge carriers are already removed while the electron channel is still open and no blocking voltage has developed across the IGBT cell(s), the electron-hole-plasma concentration is quickly removed from the drift zone(s), and the delay is reduced or eliminated even for high gate electrode resistances. The remaining plasma concentration is considerably lower and causes relatively small switching losses during turn-off.

FIGS. 7 to 12 show top views onto a semiconductor device 100 or 101 according to embodiments and illustrate different layouts. The semiconductor devices shown in FIGS. 7 to 12 include desaturation cells 400 and IGBT cells 200, which both may be identical or similar in cross-section to the desaturation channel structure 4 and IGBT cell 2 described above. The p-type doped mesa regions of the desaturation cells 400 are depicted with a hatching pattern and are connected to the source electrode terminal 28. The trenches or trench portions of the desaturation cells, more specifically the trench electrodes, are connected to the gate electrode terminal 27. The n-type doped source regions of the IGBT cells 200 are connected to the source electrode terminal 28, and the gate electrodes in trenches or trench portions are connected to the gate electrode terminal 27. The first-type doped regions of the desaturation cells 400 may all be connected or may be separate regions.

Sections in one exemplarily selected lateral direction are highlighted between reference signs A-A and B-B, wherein a cross-section along line A-A may be represented by FIG. 2 or FIG. 6, and a cross-section along line B-B may be represented by FIG. 3.

In FIGS. 7 to 10, the IGBT cells and desaturation cells are rectangular. One trench of rectangular form surrounds the body and source regions of each IGBT cell and the desaturation channel and mesa regions of each desaturation cell, confining them in all lateral directions. In cross-sections through such layouts, e.g. as shown in FIGS. 2, 3 and 6, structures 24 which may appear to be separate trenches in the cross-section are actually two portions of one trench.

Figure 7:
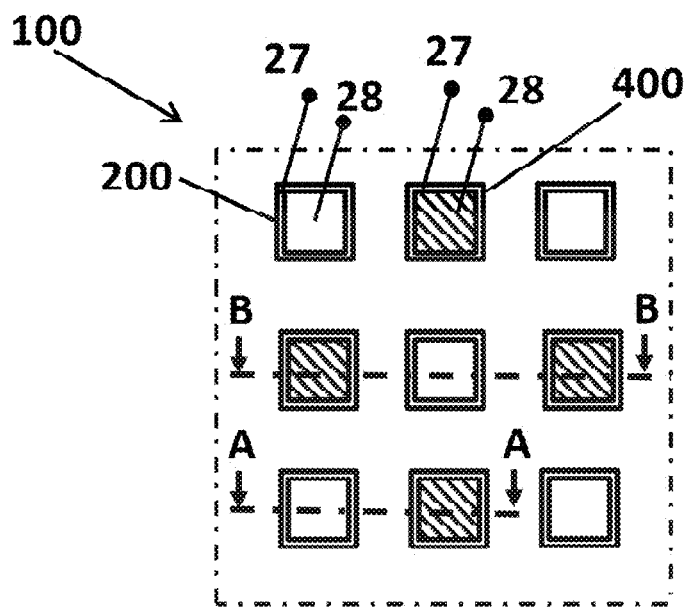
FIGS. 7 to 12 show top views of layouts of a semiconductor device according to embodiments described herein.
Figure 8:
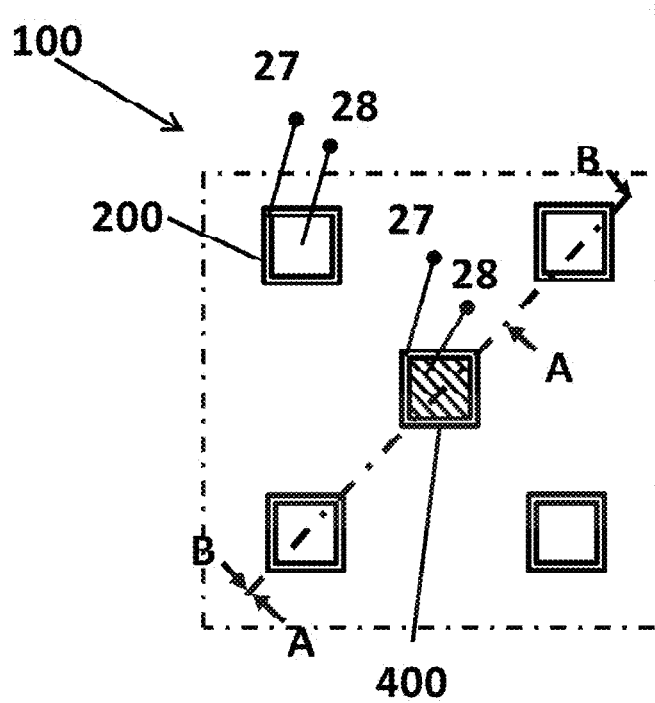

FIG. 7 shows a layout where the IGBT cells 200 and desaturation cells 400 are alternatingly arranged in rows and columns, wherein each IGBT cell has four next-neighbor desaturation cells arranged around it in the directions of the rows and columns, and each desaturation cell has four next-neighbor IGBT cells arranged around it in the directions of the rows and columns. FIG. 8 shows a layout where each desaturation cell 400 is arranged diagonally between four IGBT cells that are arranged in a square.

Figure 9:
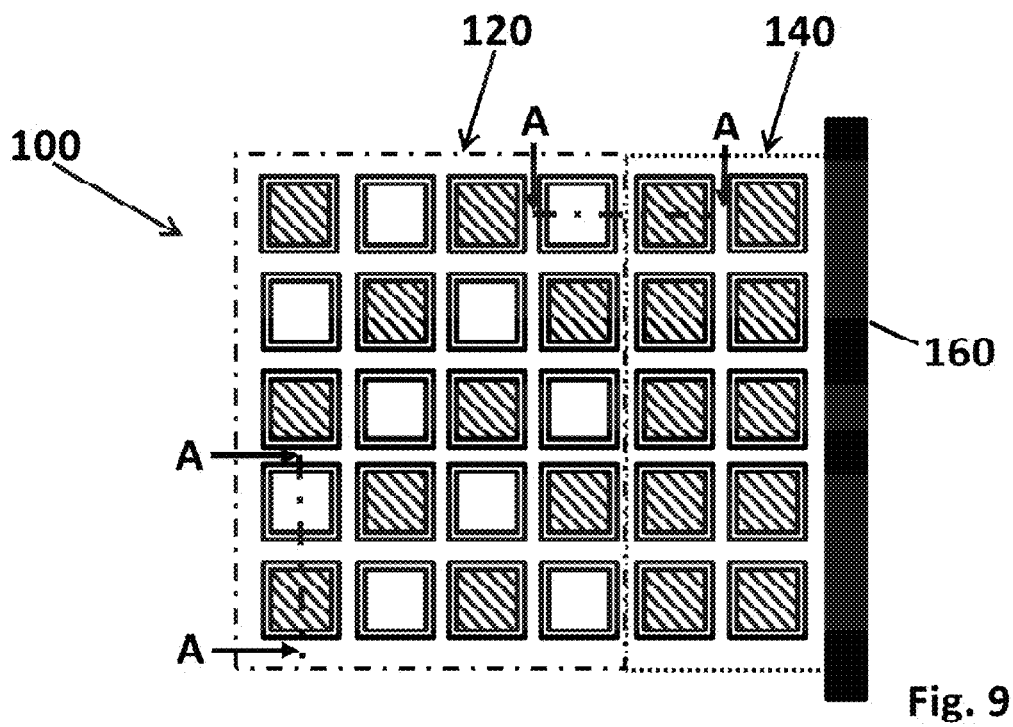
Figure 10:
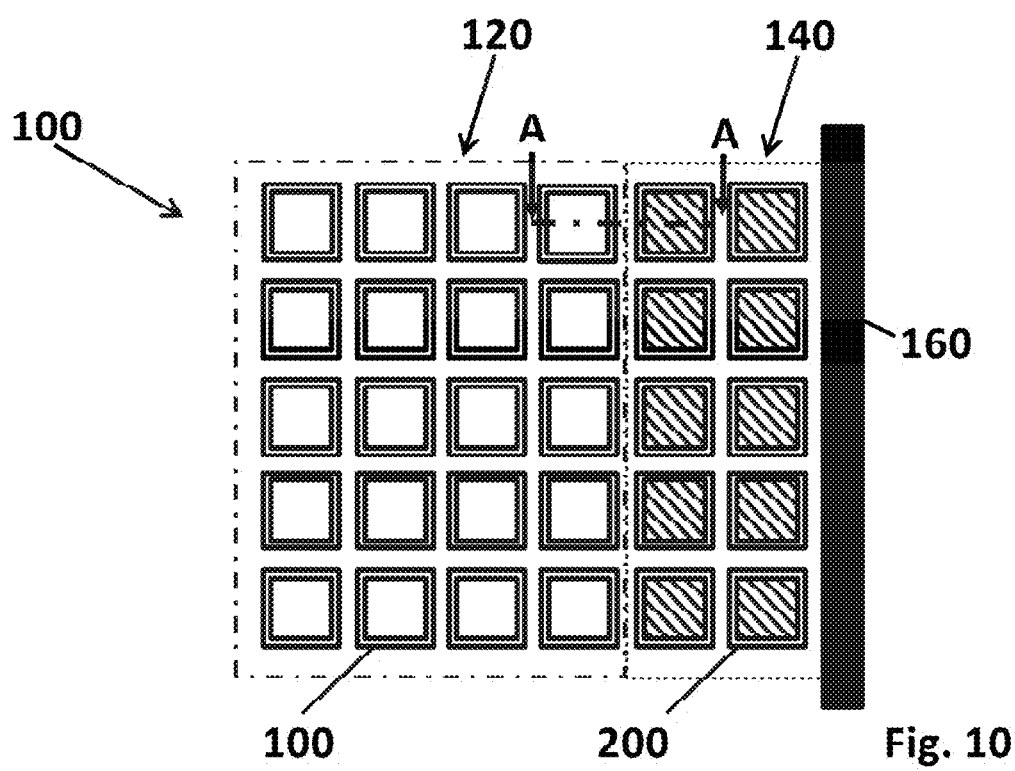

FIGS. 9 and 10 show an active region 120 of a semiconductor device 100 containing IGBT cells, a peripheral region 140 containing only desaturation cells, and a rim 160, or alternatively a gate pad or gate lead, of the semiconductor device. The higher number of desaturation cells in the peripheral region may allow to even better desaturate the drift regions of the adjacent IGBT cells. This may be especially important near the rim or gate pad of the semiconductor device. In FIG. 9, the IGBT and desaturation cells in the active region 120 are arranged substantially as in FIG. 7. The rightmost IGBT cells bordering the peripheral region have six desaturation cells for desaturating a charge concentration in their drift regions.

In FIG. 10, the active region contains only IGBT cells, but desaturation is provided at the border to the peripheral region 140, each IGBT cell bordering the peripheral region having three desaturation cells for desaturating a charge concentration in their drift regions. In a layout as shown in FIG. 10, there may not exist a cross-section as shown in FIG. 3, but only a cross-section as shown in FIG. 2 or 6. The connections to the gate and source terminals have been omitted in FIGS. 9 and 10. The size and/or the density of the IGBT cells may vary across the layout of the semiconductor device, and so may the size and/or density of the desaturation cells.

Figure 11:
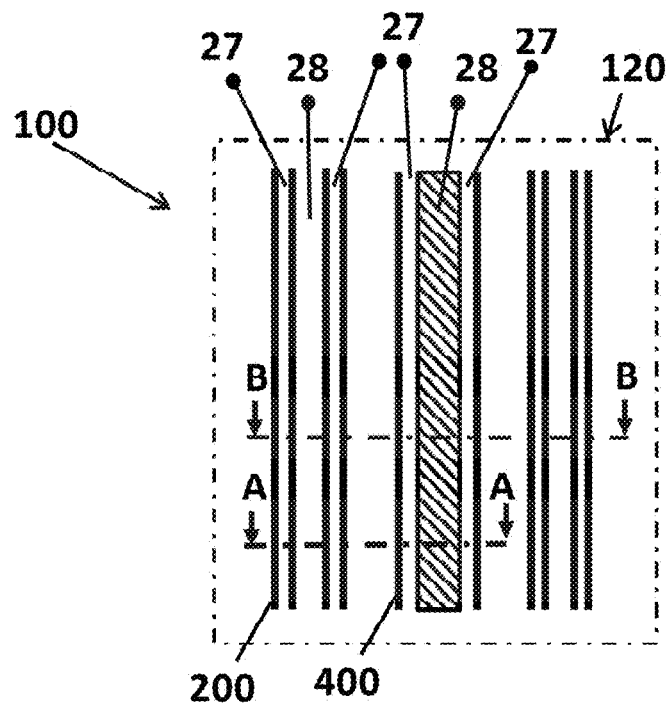
Figure 12:
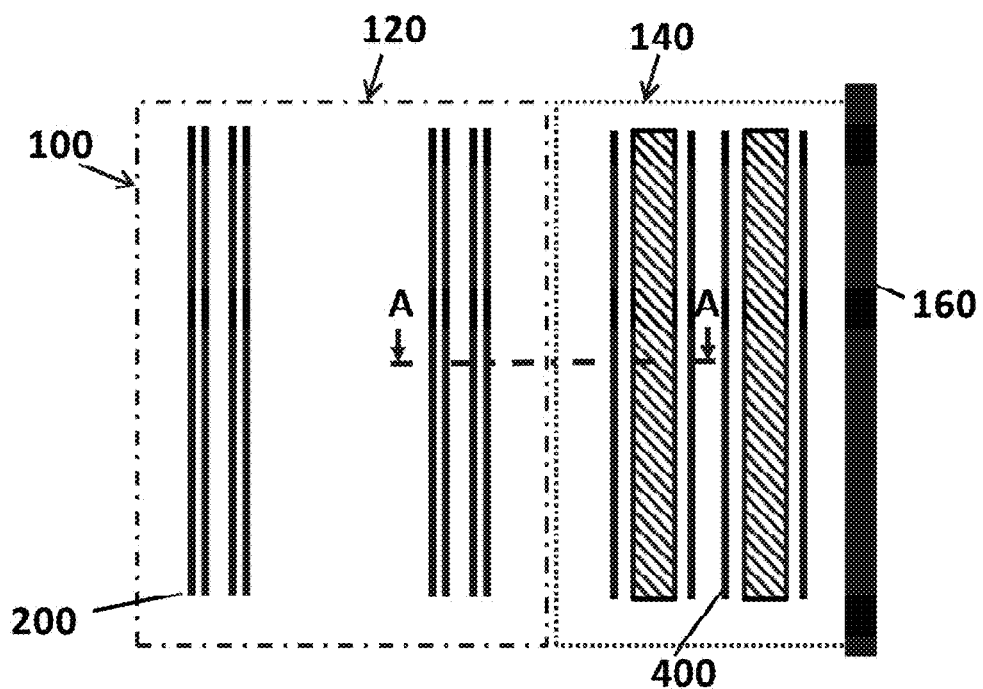

FIGS. 11 and 12 illustrate layouts of semiconductor device 100 where the IGBT cells 200 and desaturation cells 400 have a stripe geometry. In this case, if a cross-section as indicated, e.g., at reference signs A-A and B-B is taken, the structures 24 in FIGS. 2, 3 and 6 may actually be two separate trenches. FIG. 11 shows an embodiment where desaturation stripe cells 400 are included in the active region 120 of the semiconductor device 100 between IGBT stripe cells 200. FIG. 12 shows an embodiment where desaturation cells are only present in the peripheral region 140, but not in the active region 120.

According to one embodiment, a semiconductor device is provided. The semiconductor device includes a first IGBT cell. The semiconductor device may include many IGBT cells. An IGBT cell as used herein may be a vertical IGBT cell such as a trench IGBT cell described hereinabove, but may also be, e.g., a planar (lateral) IGBT cell. The semiconductor device may be power semiconductor device. The term "power semiconductor device" or "power IGBT" intends to describe a device with high voltage and/or high current switching capabilities. In other words, power semiconductor devices/IGBTs are intended for high current applications, e.g., in the Ampere range or even hundred Ampere range, and/or high voltage applications, e.g., above 300 V. The IGBT cell(s) may be included in an active region of the semiconductor device.

The first IGBT cell includes a second-type doped drift zone. The first, and possibly any other IGBT cell, may be formed in a semiconductor block or compound of the semiconductor device. The semiconductor block may be monolithic or consist of semiconductor layers, e.g. including an epitaxial layer or a layer grown by a Chochalski-type process. The IGBT cell may further include the features described, e.g., with respect to FIG. 1.

The semiconductor device includes a desaturation semiconductor structure for desaturating a charge carrier concentration in the first IGBT cell. The desaturation semiconductor structure may be adapted to remove a free charge carrier concentration, in particular a minority charge carrier concentration, from at least from the drift zone of the first IGBT cell, depending upon a controlled state of the desaturation semiconductor structure as described further below.

The desaturation semiconductor structure includes a first-type doped region forming a pn-junction with the second-type doped drift zone of the first IGBT cell. The desaturation semiconductor structure further includes a trench structure. The trench structure is arranged in the first-type doped region beside the first IGBT cell in a first lateral direction. The trench structure may extend from a first main surface of the semiconductor block into the semiconductor block, e.g., into an epitaxial layer of the semiconductor block.

The trench structure includes two portions of a trench or two trenches. The two trench portions or the two trenches are spaced apart from each other in the first lateral direction. They delimit or confine a space between them at least in this particular first lateral direction. The two trenches or the two trench portions may extend parallel to each other—at least for a certain distance—in a direction different from the first lateral direction, e.g., in a direction perpendicular thereto. The latter may be referred to as a longitudinal direction, in particular for stripe-like trench structures with two separate trenches. The trench having the two trench portions may have a square, rectangular or polygonal form or even oval or circular form in a top view on the first main surface.

Each of the two trench portions or each of the two trenches may include a wide part and a narrow part. The wide part is located below the narrow part. Trenches with this property are referred to as bottleneck trenches herein. The form of such trenches has many variations, including, e.g., the bulgy form shown in FIGS. 2 and 3 with a round or oval widening at the bottom, but also including, e.g., trenches with straight side walls that slant outward so that the trench is wider towards its bottom or trenches with rectangular widened parts. The wide part may be a bottom part of the trench or trench portion. Alternatively, the trench may extend further, having a bottom below the wide part. The narrow part may be a top part of the trench or trench portion.

Alternatively, at least one of the two trench portions or of the two trenches, typically both, may have a substantially constant width. The side walls of at least one of the two trenches/two trench portions may be substantially straight. The side walls may be vertical, but could also be tilted, i.e., form an angle different from 90° with respect to the first main surface.

The wide parts of the two trench portions or of the two trenches confine/delimit a first-type doped desaturation channel region of the first-type doped region at least in the first lateral direction. The narrow parts of the two trench portions or of the two trenches confine a first-type doped mesa region of the first-type doped region at least in the first lateral direction. In other words, the space confined by the two trenches or by the two trench portions includes the mesa region and the desaturation channel region.

Alternatively or additionally, the first-type doped desaturation channel region may be a region confined/delimited by the two trenches/trench portions and having a first-type doping lower than the adjoining regions of the first-type doped region, namely the mesa or body region and the outer region. The desaturation channel region may be characterized in this way even when confined/delimited by trenches or trench portions having a constant width or parallel side surfaces.

The space confined/delimited by the two trenches or trench portions may consist of the first-type doped mesa and desaturation channel regions. In embodiments with trenches having constant width, in particular vertical trenches with straight, parallel sidewalls, the entire space confined/delimited by the two trenches or trench portions is called "mesa region" herein, and the desaturation channel region is considered a part thereof. The first-type doped mesa region may constitute or occupy the entire space above the desaturation channel region that is confined in the first lateral direction by the two trenches or trench portions. This may be the entire space confined by narrow parts of the two trench portions or the two trenches. There may be no second-type doped region confined between the two trenches or trench portions. A second-type doped region may be present, but is not necessary for the functioning of the device. The mesa region and the desaturation channel region may be confined/delimited by a single trench including the two trench portions in more than the first lateral direction. In this case, the trench that includes the two trench portions may include further portions and may confine the mesa region and the desaturation channel region in all lateral directions, i.e., it may laterally surround said regions.

The desaturation channel region may have a width smaller than the mesa region at least in the first lateral direction. The desaturation channel region may have a width smaller than the mesa region also in at least one other lateral direction, e.g., in a (longitudinal) direction perpendicular to the first lateral direction. Additionally or alternatively, the desaturation channel region may have a first-type doping that is lower than the first-type doping of the mesa region.

The desaturation channel region and the mesa region adjoin each other. The desaturation channel region may also adjoin an outer region of the first-type doped region, the outer region extending laterally and/or vertically outward of the trench structure. The outer region may form a pn-junction with the drift region of the first IGBT cell.

The semiconductor device may include a source electrode terminal connected to a source region of the IGBT cell, a gate electrode terminal connected to a gate electrode of the IGBT cell, and a conductive semiconductor material in the two trench portions or in the two trenches, wherein the first-type doped mesa region is connected to the first electrode terminal, and the conductive semiconductor material in the two trench portions or in the two trenches is connected to the gate electrode terminal. The semiconductor material in the two trenches or in the two trench portions may be referred to as trench electrode(s). In this embodiment, the desaturation channel in the desaturation region is controlled by the voltage value applied to the gate electrode terminal. The mesa region and the trench electrode(s) might also be connected to terminals different from the source/gate terminals of the IGBT cells, possibly adding more flexibility of an independent control, but increasing the complexity.

The first-type doping of the desaturation channel region may be lower than the first-type doping of the mesa region and/or lower than the first-type doping of the outer region of the first-type doped region.

The desaturation channel structure or several of them may be arranged in a peripheral region of the semiconductor device that borders an active region including the IGBT cell(s). The desaturation channel structure or several of them may be arranged in the active region of the semiconductor device, the active region being the region including the IGBT cell(s). The semiconductor device may include a second IGBT cell, wherein the desaturation semiconductor structure is arranged between the first IGBT cell and the second IGBT cell. The first-type doped region may extend at least between the first IGBT cell and the second IGBT cell. The first-type doped region may form a pn-junction also with the drift zone of the second IGBT cell. The desaturation semiconductor structure may be adapted for desaturating charge carrier concentrations in the drift regions of the first and second IGBT cells.

The conductive semiconductor material in the two trench portions or in the two trenches—the trench electrode(s)—may be separated from the mesa region, from the desaturation region and/or from the outer region of the first-type doped region. The separation may be in the form of an oxide layer, e.g., similar to a gate oxide layer. The trench electrode(s) may be formed of a highly doped semiconductor material such as polysilicon, which partly or fully fills the trenches/trench portions. Alternatively, the separation may be in the form of a second-type doped layer, similar as in a JFET structure. By choosing appropriate doping relations between the regions of first-type and second-type doping a possibly latch-up can be avoided.

As explained before there is an interrelation between the width and the doping concentration of the desaturation channel region for tailoring control of the activation and de-activation of the desaturation channel at the right moment during the turn-off process of the IGBT cell(s). The width of the desaturation channel may be determined by the wide parts of the trenches or trench portions which laterally delimit the channel at least in one lateral direction. In this direction, the wider parts may be at least 20%, or even at least 50% wider than the narrow parts of the two trench portions or of the two trenches, e.g., from 20% to 100%. Conversely, the desaturation channel region may be 50%, or 100% or even at least 200% narrower than the mesa region. Additionally or alternatively, the first-type doping in the desaturation channel region may be at least 50 or 100%, or even at least 300% smaller than the first-type doping in the mesa region and/or in the outer region, e.g., from 50% to 500%. A laterally integrated dose of the first-type doping over the width of the desaturation channel region may be less than $10^{11}$ cm$^{-2}$ or even less than $3*10^{10}$ cm$^{-2}$.

By appropriate dimensioning of the distance between the wide parts of the trenches or trench portions, e.g., of the bulgy parts shown in FIGS. 2 and 3, and/or by appropriate choice of the doping concentration in the desaturation channel region (see FIG. 6 for illustration) the instant of time during the switching process where free charge carriers can be guided through the desaturation channel can be defined and set. The turn-off losses can be reduced without increasing the static losses in the on-state.

The threshold voltage value below which the channel becomes conducting can be chosen above the value of the miller plateau voltage. The desaturation channel region can have a threshold voltage for switching-off a conductive path through the desaturation channel region. The IGBT cell can have a threshold voltage for providing an inversion channel. The absolute value of the threshold voltage for switching-off the conductive path through the desaturation channel region may be higher than the absolute value of the threshold voltage for providing an inversion channel of the IGBT cell.

According to another embodiment, a method of operating a semiconductor device is provided. The semiconductor device includes a first electrode terminal, a second electrode terminal, a gate electrode terminal, and a first IGBT cell including a gate electrode, a first electrode, a second electrode and a drift region. The gate electrode is connected to the gate electrode terminal, the first electrode is connected to the first electrode terminal, and the second electrode is connected to the second electrode terminal. The semiconductor device further includes a desaturation semiconductor structure including a desaturation channel. A first portion of the desaturation semiconductor structure is connected to the first electrode terminal. A second portion of the desaturation semiconductor structure is connected to the gate electrode terminal for controlling the desaturation channel. The semiconductor device may be a semiconductor device according to any of the embodiments described herein.

The method includes applying a gate voltage with a first value to the gate electrode terminal so that a current flows through the first IGBT cell between the first electrode terminal and the second electrode terminal and so that a current flow through the desaturation channel is substantially blocked. The term "substantially blocked" includes the situation that desaturation channel is completely blocked, i.e., the desaturation channel is completely choked off. The term "substantially blocked" also includes the situations that the current flow is significantly reduced. The desaturation channel is said to be substantially blocked if the current flow through the desaturation channel is reduced by at least 50%, or at least 80% or even at least 90 or 99% as compared to desaturating current that flows when the second value of the gate voltage is applied to the gate electrode terminal. In these cases, the desaturation channel may not be completely choked off. The first value may represent the operating voltage of the semiconductor device. The first value may be, e.g., between +12 V and +20 Volts, e.g., about +15 V.

The method further includes applying the gate voltage with a second value to the gate electrode terminal. The second value may be applied transiently during switching off of the device. The absolute value of the second value is lower than the absolute value of the first value. The second value may be, e.g., between +8V and +12V Volts, e.g., about +10 V. When applying the gate voltage with the second value a current flows through the first IGBT cell between the first electrode terminal and the second electrode terminal and charge carriers flow, as a desaturating current, from the drift region of the first IGBT cell through the desaturation channel of the desaturation semiconductor structure to the first electrode terminal.

The method may further include applying the gate voltage with a third value to the gate electrode terminal. The absolute value of the third value is lower than the respective absolute values of the first and second values. When applying the gate voltage with the third value, a current flow through the first IGBT cell between the first electrode terminal and the second electrode terminal is substantially blocked. The third value may represent a blocking voltage of the semiconductor device. The third value may be below +3V, e.g., about zero Volts, or may be a negative voltage value, i.e., even a negative voltage can be applied.

As explained above, one quantity through which the exact instant in time can be determined when the desaturation channel opens during switching off of the semiconductor device is the width of the desaturation channel region. Accordingly, for such embodiments, it is desirable to form the confining wide parts of the trenches or trench portions of the desaturation channel structure with low manufacturing tolerances.

The wide parts below the narrow parts may be formed by anisotropic etching to form a normal trench with vertical side walls, followed by isotropic etching at the bottom of the trench to from an undercut. The manufacturing tolerances might not be sufficient with this technique, and a need for improvement exists.

A method of forming a bottleneck-type trench structure of a semiconductor device according to an embodiment is provided. The term "bottleneck-type" refers to any trench or trench structure wherein the trench has a wide part and a narrow part, the wide part being below the narrow part, i.e., the wide part is at a position deeper in the trench than the narrow part. Trenches of bottleneck type include, e.g., trenches having a wide cavity as their bottom part, e.g., a cavity with circular, oval, or rectangular cross-section, and a narrower tunnel leading to that cavity from the surface of semiconductor layer or block. The trenches of bottleneck type also include, e.g., trenches with straight side walls slanting outward towards the bottom, or any other form of undercut.

FIGS. 13 to 18 show an exemplary manufacturing process of a bottleneck-type trench structure. The trench structure may be manufactured for the desaturation channel structure, for example, for the structure shown in FIG. 2. The manufacturing process described in the following may be applied to any kind of a trench structure. The described process may also be applied to the manufacturing of mesa-IGBT or any other kind of IGBT.

FIGS. 13-18 show an example of manufacturing a trench structure having a wider or bulgy bottom part. Trenches are formed into a semiconductor block including silicon material. The trenches may be formed using any of the conventional trench-etching processes. Such a process may, for example, include forming a mask, such as a hard mask or photo mask, onto the surface of a semiconductor block. In order to form the mask, by way of example, a photoresist is deposited over the whole surface of the semiconductor block and is suitably patterned using photolithography, wherein openings that define the position of the later trenches are formed into the photoresist.

Figure 13:
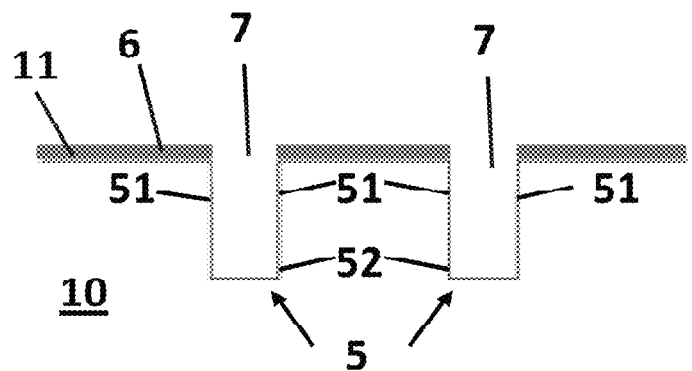
FIGS. 13 to 18 illustrate a manufacturing method of a bottleneck-type trench structure of a semiconductor device according to embodiments described herein.

Using the patterned mask the trenches are formed into the semiconductor block by an etching process as illustrated in FIG. 13. The etching may be applied selectively with respect to the patterned mask and is typically embodied as anisotropic etching in the form of dry or wet etching, such that trenches having substantially vertical side walls arise.

The trench structure obtained after the trench-etching process is depicted in FIG. 13. In detail. FIG. 13 shows a cross-section of a portion of a semiconductor device with a semiconductor block 10, such as shown in FIGS. 2-3. The above described patterned mask 6 with openings 7 for the trenches is shown on a first surface 11 of the semiconductor block 10. The trenches or trench portions 5 extend from the first surface 11 and have lateral sides 51 and a bottom side 52. The width of the trenches or trench portions 5 is substantially constant along their vertical extension.

The shown cross-sections of the trenches or trench portions 5 may form part of either two trenches, for example in a stripe-type IGBT cell as shown in FIG. 11 or 12, or one trench if this trench has, for instance, a rectangular or possibly polygonal, oval or circular layout in a top view on the first main surface 11 as shown, e.g., in FIGS. 7 to 10.

Figure 14:
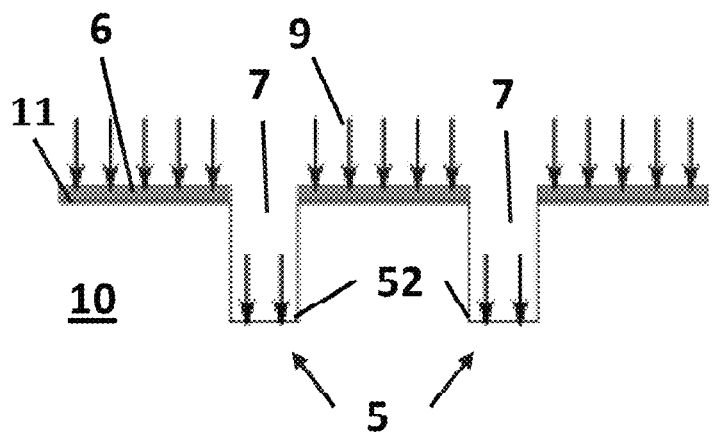

In FIG. 14, the completed trenches or trench portions 5 are set up for forming the bulgy bottom parts of the bottleneck-type trench structure. Phosphorus is introduced as a dopant 9 into the bottom side 52 of the trenches or trench portions 5 using the patterned mask 6, as illustrated in FIG. 14. Phosphorus 9 is preferably introduced using ion implantation techniques. Alternatively, phosphorus 9 can also be introduced by means of a mask diffusion furnace process using liquid or solid sources. The diffusion mask deposited on the side walls of the trenches can be, e.g., a silicon nitride layer.

The dose of the implanted dopant determines the characteristic and dimension of the later bulgy bottom parts. In FIG. 14, phosphorus is exclusively introduced into the bottom side 52 of the trenches or trench portions 5.

The mask 6 originally provided for the etching of the trenches or trench portions 5 accordingly serves as an implantation mask in FIG. 14, such that phosphorus 9 is only introduced into the bottoms side 52 of the trenches or trench portions 5.

A first thermal process, typically a high-temperature thermal process, is carried out. The thermal process initiates a diffusion process of the phosphorus implanted in the bottom side of the trenches or trench portions as illustrated in FIG. 15.

Before carrying out the thermal process the patterned mask 6 may be removed selectively with respect to the first surface 11 of the semiconductor block 10, for example, by means of wet-chemical etching.

Figure 15:
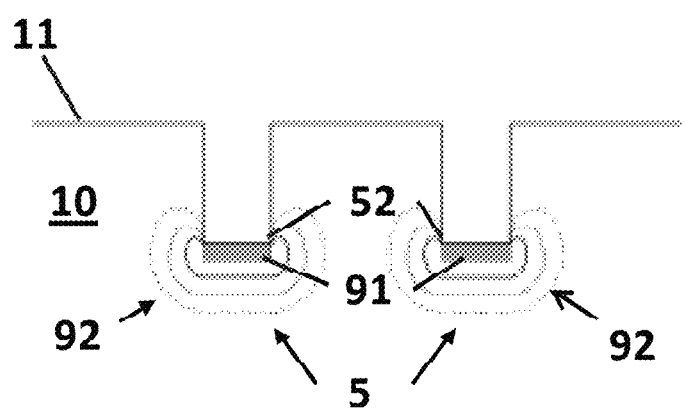

FIG. 15 shows the diffusion region 92 in which the implanted phosphorous 91 penetrates once the diffusion process is initiated by the first thermal process. The diffusion region 92 starts growing from the bottom side 52 of the trenches or trench portions 5 where the phosphorous 9 was originally implanted. The implanted dopant 91 diffuses into the depth of the semiconductor block 10 forming a bulgy or an approximately apple-shaped diffusion region 92 around the bottom side 52 of the trenches or trench portions 5.

The vertical and lateral dimensions of the diffusion region 92 may be controlled by the dose of the implanted dopant and the parameters of the first thermal process, such as temperature and duration. The higher the implanted dose of dopant, the greater the vertical and lateral extent of the diffusion region 92. The longer the duration of the thermal process, the greater the vertical and lateral extent of the diffusion region 92.

In suit, in the manufacturing of the bulgy bottom parts of the bottleneck-type trench structure, material from the region defined by the thermal diffusion process will be removed, namely from the diffusion region.

Before removing the material from the diffusion region, the diffusion region is oxidized. The oxidation of the diffusion region is carried out in a second thermal process. The temperature range of the second thermal process is chosen depending on the oxidation process. The oxidation process may be a dry oxidation process. Preferably a wet oxidation process is carried out.

The oxidation rate of the above described oxidation processes depends on the dopant concentration present in the diffusion region 92. The higher the dose of the dopant, the higher the dopant concentration in the diffusion region and therefore the higher the oxidation rate. Due to the different dopant concentrations in the lateral sides 51 and the bottom 52 of the trenches or trench portions 5 the oxidation process is selective and the oxidation rate is dependent on the dopant concentration.

Figure 16:
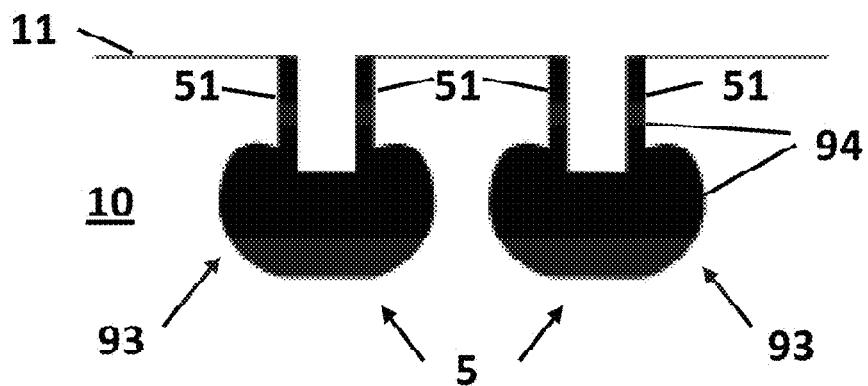

FIG. 16 illustrates the trenches or trench portions 5 after an oxidation process as described above. An oxidation region 94 is formed in the lateral sides 51 and the bulgy region 93. The bulgy region 93 is defined by the preceding diffusion process and substantially matches the diffusion region 92 in FIG. 15.

Since there is substantially no dopant implanted in the lateral sides 51 of the trenches or trench portions 5 in this embodiment the oxidation rate in the lateral sides 51 is low and the lateral dimension of the oxidation region 94 in the lateral sides 51 is small. The dopant concentration in the bulgy region 93 is much higher than the dopant concentration in the lateral sides 51. As a result, substantially the whole bulgy region 93 is oxidized.

Removing the material of the oxidation region 94 is effected by means of a selective etching process. The etching process may be carried out by dry etching. Preferably, a wet etching process is carried out to form the bulgy bottom parts. The etching may be affected in a time-controlled manner. The etching may be carried out for a predetermined etching time.

Figure 17:
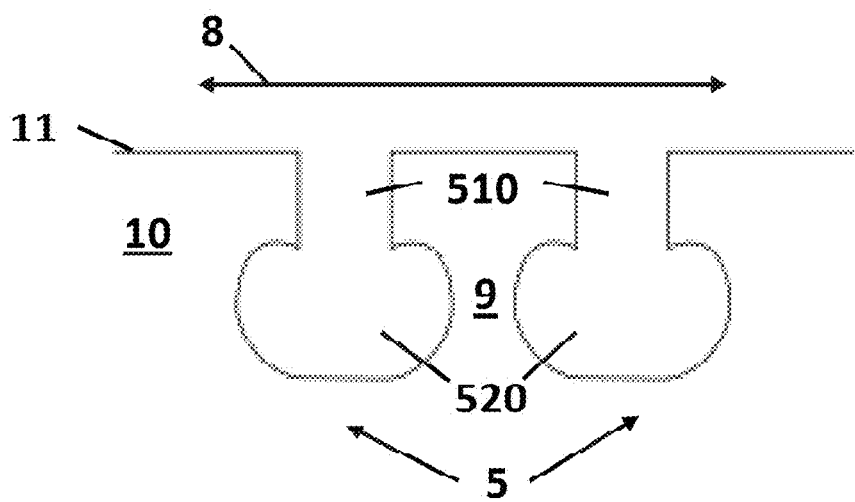

FIG. 17 shows the trenches or trench portions 5 obtained after the above described etching process. An upper part 510 and a bulgy bottom part 520 form part of the trenches or trench structures 5. The bulgy bottom part 520 is wider than the upper part 510 in a lateral direction 8 and is arranged below the upper part 510. The two bulgy bottom parts 520 of the respective trenches or trench portions 5 may confine or delimit a channel region 9 of a semiconductor device in the lateral direction 8, e.g., a desaturation channel region as described herein. The upper part 510 may also be referred to as a bottleneck.

Figure 18:
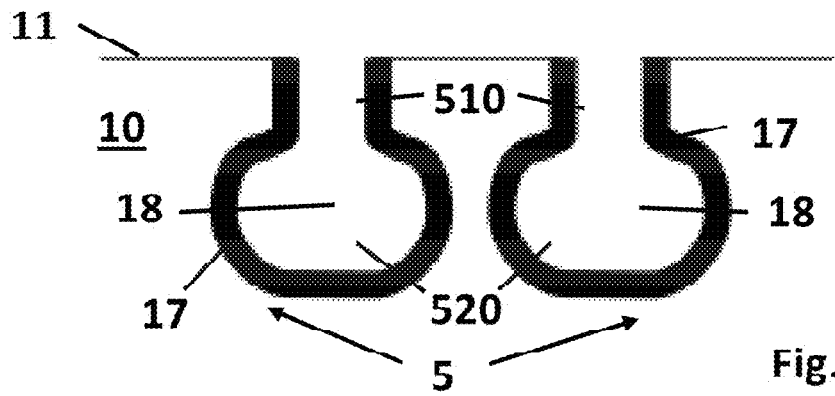

For insulating the completed trenches or trench portions 5 with bulgy bottom parts an oxide layer is formed. FIG. 18 shows the trenches or trench portions 5 with an oxide layer 17 lining the upper parts 510 and the bulgy bottom parts 520. The trenches or trench portions 5 may subsequently be filled with a conductive material 18, for example polysilicon. As a result, the oxide layer 17 provides insulation between the conductive material 18 inside the trenches or trench portions 5 and the semiconductor block 10 and the channel region 9, respectively.

According to a further embodiment, a method of forming a bottleneck-type trench structure of a semiconductor device is provided. The trench structure may be the trench structure of a desaturation channel structure or desaturation cell according to embodiments described herein. The trench structure may alternatively be the trench structure of a mesa-IGBT with Partially Narrow Mesa (PNM), or may be any other trench structure of some semiconductor device.

The method includes forming a trench in a semiconductor layer of the semiconductor device. The term "semiconductor layer" shall include the notion of a multi-layer including two or more sublayers, wherein the trench may penetrate into one, two or more of the sublayers. The semiconductor layer may be silicon-containing semiconductor layer, e.g., an epitaxially grown silicon layer, which may have been doped appropriately. The semiconductor layer may have a first-type doping. The semiconductor layer may be the first-type doped region of a desaturation channel structure according to embodiments described herein.

The trench has lateral sides and a bottom side. The trench may be formed with substantially vertical side walls. The trench may be formed in the first main surface of the semiconductor device, i.e., into its front surface. Conventional techniques may be used, e.g., forming a patterned trench etch mask and anisotropically etching the semiconductor layer using the patterned trench etch mask.

The method includes introducing a dopant into the bottom side. The dopant may be an n-type dopant such as phosphorus, but may also be arsenic and/or antimony, or p-type dopants such as boron and gallium, or may be any combination of the aforementioned. The implantation dose can lie in a range of $10^{14}$ cm$^{-2}$ to $10^{17}$ cm$^{-2}$ such as about $10^{15}$ cm$^{-2}$. The dopant may be introduced exclusively into the bottom side of the trench. Alternatively, the dopant may be introduced in a bottom part of the trench. The dopant may be introduced into sections of the side wall that are not topmost sections. The dopant may be introduced by implantation. The trench etch mask may be used for introducing the dopant, in particular for implanting the dopant. Alternatively, an implantation mask different from the trench etch mask may be used.

The dopant may be introduced by means of a masked diffusion furnace process using liquid or solid sources. In the case of phosphorus, this can be affected for example on the basis of POCl$_3$. Introducing the dopant may include tilting the semiconductor layer. This may improve the accuracy of the introduction of the dopant into selected sections of the trench sides.

The trench etch mask or implantation mask is subsequently removed, for example by means of wet-chemical etching. Buffered HF acid may be used for selective etching. In this case, the etching can be carried out in a time-controlled manner, i.e., by an etching with a predetermined etching time or with end point control.

The method further includes heating the semiconductor device for diffusing the dopant into a diffusion region. The diffusion region may have its center at the bottom of the trench where the dopant was introduced. Heating may be carried out for a heating time period in the range of from 60 min to 600 min, e.g., in a range of from 120 min to 140 min. The heating temperature may be in a range of from 800° C. to 1300° C., e.g., in a range of from 900° C. to 1100° C. The size of the diffusion region may be controlled by the implanted dose of the dopant and the parameters of the heating process. Several heating processes may be carried out.

The method further includes selectively etching the diffusion region to form the bottleneck-type trench structure. The selective etching may be accompanied by oxidizing the diffusion region. According to a first alternative, this oxidation may take place prior to selectively etching the (oxidized) diffusion region. According to a second alternative, the oxidation may take place during the selective etching process, i.e., a combined oxidizing and selective etching process may be carried out.

In the first alternative, the method may include oxidizing the diffusion region, and subsequently selectively etching the oxidized diffusion region. Oxidizing the diffusion region may be wet-chemical oxidizing. Wet-chemical oxidization provides fast oxidization. The oxidization of the diffusion region can be faster than the oxidization of other parts of the trench. For instance, when using phosphorus as a dopant in a silicon-containing semiconductor layer, the oxidation rate of silicon with high phosphorus doping concentrations is greatly increased as compared to regions of the silicon-containing layer without phosphorus. The oxidization process may be a time-controlled oxidization process.

In the second alternative of selective etching, selectively etching the diffusion region may include selectively etching the diffusion region in an acid etching solution. The acid etching solution may include an oxidizing component. The oxidizing component may be adapted to selectively, i.e., primarily, oxidize the diffusion region containing the dopant. The acid solution may further include a removing component adapted to selectively etch the material oxidized by the oxidizing component. For instance, the acid solution may include or consist of $HNO_3$ and HF.

By controlling the etching rate through the concentration of the dopant, e.g., phosphorus, variations in the dimensions of a trench structure can be reduced as compared to anisotropic etching. Further, the variance in the distribution of the dimensions of trench structures across a wafer or chip can be kept small in contrast to a processing by anisotropic etching.

In both alternatives, the overall process of selectively etching may be time-controlled. Alternatively or additionally, the process of selectively etching may be controlled by detecting a detection material while selectively etching the diffusion region. The detection material may be freed during the etching process. The freed detection material may be a gas. The detection may take place in a dummy trench different from the trench described hereinbefore. The detection material may have been introduced into the dummy trench at a specific place, e.g., into its sidewalls or into a side wall oxide, such that, when the detection material is detected, this will indicate that the selective etching process has progressed to this place and will indicate that the selective etching process shall be terminated.

The method may include forming a dummy trench in the semiconductor layer. The dummy trench may be formed parallel to the trench(es) of a desaturation channel structure according to embodiments described herein. The dummy trench may be formed outside of the desaturation channel structure, i.e., spatially separated from the desaturation channel structure. The dummy trench may be formed in an active region of a semiconductor device. In this case, one or more dummy trenches may be seen in cross-sections such as those shown in FIGS. 2 and 3. Alternatively, the dummy trench may be formed in a peripheral region of the semiconductor device, where no active IGBT cells are present. The presence of such dummy trenches can be an indicator that the method of forming a trench structure according to embodiments described herein has been performed.

The dummy trench has lateral sides and a bottom side. The method may include introducing the detection material into the lateral sides and/or into the bottom side of the dummy trench. The method may include introducing the dopant into the bottom side of the dummy trench, heating the semiconductor device for diffusing the dopant into a diffusion region of the dummy trench, and selectively etching the diffusion region of the dummy trench. The introduction of the dopant, the heating and the selective etching process may be the same as those described herein for forming a desaturation channel structure. They may take place simultaneously. The dummy trench may be different from trench(es) of the desaturation channel structure, e.g., the dummy trench may be a conventional, straight-walled trench instead of a bottleneck-type trench. Forming the dummy trench need not use dopant introduction, and/or oxidation of a diffusion region. The method may include detecting a detection material while selectively etching the dummy trench, e.g., its diffusion region. The method may include stopping the selective etching of the diffusion region of the trench when the detection material is detected.

The method may include closing off the trench, e.g., at its top. A Venecia-process may be used for this purpose. This may improve encapsulation of the detection material during processing the semiconductor device, and may improve the detectability of the detection material. The quality and accuracy of the detection and hence of the control of the process may be improved. According to further embodiments, the method of forming a bottleneck-type trench structure of a semiconductor device may include oxidizing all sides of the bottleneck-type trench structure for providing an oxide layer, and filling the bottleneck-type trench structure at least partly with a conductive semiconductor material, e.g., highly doped polysilicon. Therein, the oxide layer may provide insulation between the conductive semiconductor material in the bottleneck-type trench structure and the semiconductor layer. Alternatively, the method may include doping all sides of the bottleneck-type trench structure for providing a separation layer, and filling the bottleneck-type trench structure at least partly with a conductive semiconductor material, such as polysilicon. Therein, the semiconductor layer has a first-type doping and the separation layer has a second-type doping for providing a separation between the conductive semiconductor material in the bottleneck-type trench structure and the semiconductor layer.

The method of forming a bottleneck-type structure may be part of a method of forming a desaturation channel structure. Forming a desaturation channel structure may include all processes needed to form a semiconductor device according to embodiments described herein.

Alternatively, the method of forming a bottleneck structure may, e.g., be part of a method of forming a self-constricting n-channel, e.g., for peak current-safe diodes. Therein, the semiconductor layer is n-type doped. The separation layer may be p++-doped, e.g., by diborane doping from a gas phase or by PLAD implantation.

Although specific features of various embodiments of the invention may be shown in some drawings and not in others, this is for convenience only. In accordance with the principles of the invention, any feature of a drawing may be referenced and/or claimed in combination with any feature of any other drawing.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, zones etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a first IGBT cell comprising:
   a second-type doped drift zone;
   a source region and a first electrode terminal connected to the source region of the IGBT cell; and
   a gate electrode and a gate electrode terminal connected to the gate electrode of the IGBT cell; and
   a desaturation semiconductor structure for desaturating a charge carrier concentration in the first IGBT cell, the desaturation semiconductor structure comprising:

a first-type doped region forming a pn-junction with the drift zone;

two portions of a trench or two trenches arranged in the first-type doped region, each of the two trench portions or each of the two trenches confining a first-type doped desaturation channel region of the first-type doped region at least in a lateral direction and a first-type doped mesa region of the first-type doped region at least in the lateral direction, wherein the desaturation channel region and the mesa region adjoin each other; and a conductive material in the two trench portions or in the two trenches, wherein the first-type doped mesa region is connected to the first electrode terminal, and the conductive material in the two trench portions or in the two trenches is connected to the gate electrode terminal.

2. The semiconductor device of claim 1, wherein the desaturation channel region has a threshold voltage for switching-off a conductive path through the desaturation channel region, and the IGBT cell has a threshold voltage for providing an inversion channel, and wherein an absolute value of the threshold voltage for switching-off the conductive path through the desaturation channel region is higher than an absolute value of the threshold for providing an inversion channel of the IGBT cell.

3. The semiconductor device of claim 1, wherein an outer region of the first-type doped region outside of the two trench portions or of the two trenches adjoins the desaturation channel region, and wherein the first-type doping of the desaturation channel region is lower than at least one of the first-type doping of the mesa region and the first-type doping of the outer region.

4. The semiconductor device of claim 1, wherein the first-type doped mesa region constitutes the entire space confined in the lateral direction by narrow parts of the two trench portions or the two trenches.

5. The semiconductor device of claim 1, further comprising:
a second IGBT cell,
wherein the desaturation semiconductor structure is arranged between the first IGBT cell and the second IGBT cell, the first-type doped region extends at least between the first IGBT cell and the second IGBT cell, and the desaturation semiconductor structure is configured to desaturate charge carrier concentrations in drift regions of the first and second IGBT cells.

6. The semiconductor device of claim 1, wherein a conductive semiconductor material in the two trench portions or in the two trenches is separated by an oxide layer and/or by a second-type doped layer from the mesa region, from the desaturation region and from an outer region of the first-type doped region, the outer region being located outside of the two trench portions or of the two trenches and adjoining the desaturation channel region.

7. The semiconductor device of claim 1, wherein at least one of:
(i) the semiconductor device is a power semiconductor device;
(ii) the first-type doping is a p-type doping;
(iii) wide parts of the two trench portions or the two trenches are at least 20% wider than narrow parts of the two trench portions or of the two trenches;
(iv) the first-type doping in the desaturation channel region is at least 50% smaller than the first-type doping in the mesa region;

(v) the first-type doping in the desaturation channel region is at least 50% smaller than the first-type doping in an outer region of the first-type doped region, the outer region being located outside of the two trench portions or of the two trenches and adjoining the desaturation channel region; and
(vi) the desaturation channel region is at least 50% narrower than the mesa region.

8. A semiconductor device, comprising:
a first IGBT cell comprising a second-type doped drift zone and a first-type doped body region forming a pn-junction with the drift zone; and
a desaturation semiconductor structure adjacent the first IGBT cell and configured to desaturate a charge carrier concentration in the drift zone of the first IGBT cell when the first IGBT cell is in the process of switching off, the desaturation semiconductor structure comprising:
a first-type doped region forming a pn-junction with the drift zone; and
two trenches arranged in the first-type doped region and arranged beside the first IGBT cell in a lateral direction, wherein the two trenches confine a mesa region comprising a first-type doped desaturation channel region and a first-type doped body region at least in the lateral direction, wherein the desaturation channel region and the body region of the desaturation semiconductor structure adjoin each other, wherein the desaturation channel region is a depletable region.

9. The semiconductor device of claim 8, wherein in the desaturation semiconductor structure, the first-type doping of the desaturation channel region of the mesa region is lower than the first-type doping of the body region of the mesa region.

10. The semiconductor device of claim 8, wherein in the desaturation semiconductor structure, the desaturation channel region of the mesa region is arranged below the body region of the mesa region.

11. The semiconductor device of claim 8, further comprising:
a first electrode terminal connected to a source region of the first IGBT cell;
a gate electrode terminal connected to a gate electrode of the first IGBT cell; and
a conductive material in the two trenches,
wherein the first-type doped mesa region is connected to the first electrode terminal, and the conductive material in the two trenches is connected to the gate electrode terminal.

12. The semiconductor device of claim 8,
wherein the first IGBT cell has a threshold voltage for forming an inversion channel in the body region of the first IGBT cell,
wherein the desaturation semiconductor structure has a threshold for depleting the desaturation channel region,
wherein an absolute value of the threshold of the first IGBT cell is lower than an absolute value of the threshold of the desaturation semiconductor structure.

13. The semiconductor device of claim 8, further comprising:
a second IGBT cell,
wherein each of the first IGBT cell, the second IGBT cell, and the desaturation semiconductor structure has a stripe geometry, wherein the desaturation semiconductor structure is arranged between the first IGBT cell and the second IGBT cell.

14. A semiconductor device, comprising:
a first IGBT cell comprising a second-type doped drift zone and a first-type doped body region forming a pn-junction with the drift zone; and
a desaturation semiconductor structure adjacent the first IGBT cell and configured to desaturate a charge carrier concentration in the drift zone of the first IGBT cell when the first IGBT cell is in the process of switching off, the desaturation semiconductor structure comprising:
a first-type doped region forming a pn-junction with the drift zone; and
two portions of a trench arranged in the first-type doped region and arranged beside the first IGBT cell in a lateral direction, wherein the two trench portions of the trench confine a mesa region comprising a first-type doped desaturation channel region and a first-type doped body region at least in the lateral direction, wherein the desaturation channel region and the body region of the desaturation semiconductor structure adjoin each other, wherein the desaturation channel region is a depletable region.

15. The semiconductor device of claim 14, wherein in the desaturation semiconductor structure, the first-type doping of the desaturation channel region of the mesa region is lower than the first-type doping of the body region of the mesa region.

16. The semiconductor device of claim 14, wherein in the desaturation semiconductor structure, the desaturation channel region of the mesa region is arranged below the body region of the mesa region.

17. The semiconductor device of claim 14, further comprising:
a first electrode terminal connected to a source region of the first IGBT cell;
a gate electrode terminal connected to a gate electrode of the first IGBT cell; and
a conductive material in the two portions of the trench,
wherein the first-type doped mesa region is connected to the first electrode terminal, and the conductive material in the two portions of the trench is connected to the gate electrode terminal.

18. The semiconductor device of claim 14,
wherein the first IGBT cell has a threshold voltage for forming an inversion channel in the body region of the first IGBT cell,
wherein the desaturation semiconductor structure has a threshold for depleting the desaturation channel region,
wherein an absolute value of the threshold of the first IGBT cell is lower than an absolute value of the threshold of the desaturation semiconductor structure.

* * * * *